US006063697A

United States Patent [19]

Wolf et al.

[11] Patent Number: 6,063,697

[45] Date of Patent: May 16, 2000

[54] CRUSHING OF SILICON ON ULTRAPURE ICE

[75] Inventors: Reinhard Wolf, Emmerting; Dirk Flottmann, Altoetting; Matthäus Schantz, Reut, all of Germany

[73] Assignee: Wacker-Chemie GmbH, Munich, Germany

[21] Appl. No.: 09/052,661

[22] Filed: Mar. 31, 1998

[30] Foreign Application Priority Data

Apr. 18, 1997 [DE] Germany ............................ 197 16 374

[51] Int. Cl.[7] ........................... H01L 21/322; H01L 21/00

[52] U.S. Cl. ............................................. 438/472; 438/800

[58] Field of Search ...................................... 438/472, 800

[56] References Cited

U.S. PATENT DOCUMENTS

| | | | |
|---|---|---|---|
| 4,820,650 | 4/1989 | Nagae et al. | 438/472 |
| 4,883,775 | 11/1989 | Kobayashi | 438/800 |
| 5,013,693 | 5/1991 | Guckel et al. | 438/472 |
| 5,348,893 | 9/1994 | Yamagishi | 438/800 |
| 5,443,863 | 8/1995 | Neely et al. | 427/579 |
| 5,464,480 | 11/1995 | Matthews | 134/1.3 |

*Primary Examiner*—John F. Niebling
*Assistant Examiner*—Walter L. Lindsay
*Attorney, Agent, or Firm*—Collard & Roe, P.C.

[57] ABSTRACT

A device for protecting semiconductor material includes a support and a surface made of ice formed from ultrapure water. Semiconductor material is situated on this support surface.

7 Claims, No Drawings

CRUSHING OF SILICON ON ULTRAPURE ICE

BACKGROUND OF THE INVENTION

1. Field of the Invention

The present invention relates to a devices for protecting semiconductor material and a method for protecting semiconductor material.

2. The Prior Art

High-purity semiconductor material is required for the production of solar cells or electronic components, such as for example storage elements or microprocessors. It is therefore desirable to keep the concentration of harmful impurities as low as possible. It is frequently observed that semiconductor material which has already been produced to a high level of purity is contaminated again during the course of further processing to give the desired products. For this reason, expensive purification steps are repeatedly performed in order to maintain the original purity. For example, atoms of foreign metals, which become incorporated into the crystal lattice of the semiconductor material, have an influence on the charge distribution and the life time. These foreign metal atoms can reduce the functioning capacity of the ultimate component or even lead to this component failing. Consequently, contamination of the semiconductor resulting from metallic contaminants is to be avoided. This applies in particular to silicon, which is the most frequently employed semiconductor material in the electronics industry.

High-purity silicon is obtained, for example, by thermal decomposition of silicon compounds which are readily volatile. Hence, these compounds are easy to purify using distillation methods, such as for example the compound trichlorosilane. High-purity silicon is produced using the Siemens process, which is the most commonly employed process. In this process, a mixture of trichlorosilane and hydrogen is guided, in a bell-jar reactor, over thin silicon rods which are heated by the passage of direct current to approximately 1110° C. This produces polycrystalline silicon in the form of rods which have typical diameters of from 70 to 300 mm and lengths of from 500 to 2500 mm. The polycrystalline silicon is used to produce crucible-pulled monocrystals, strips and foils or to manufacture polycrystalline solar cell base material.

To produce these products, it is necessary to melt solid silicon in crucibles. It is desirable to fill the crucible to a high level, and thus to carry out the melting as efficiently as possible. Thus, the above-mentioned polycrystalline silicon rods have to be comminuted prior to melting and then have to be screened. This usually involves contaminating the surface of the semiconductor material. This is because the comminution is carried out using metallic crushing tools, such as jaw or rolling crushers, hammers or chisels on substrates made of materials such as steel or plastic. In addition, the subsequent screening operation usually takes place on screens made from metal or plastic. Thus the silicon is contaminated by metals or carbon from the tools and the substrate during the comminution operation and the screening step. In order to remove this contamination, the fragments have to be subjected prior to melting to a complex and cost-intensive surface purification, for example by etching with $HF/HNO_3$.

For this reason, silicon substrates and tools made of silicon or with silicon coatings are also used to reduce the contamination during comminution. Screens made of silicon or silicon-coated screens also form part of the prior art in the screening operation. However, they have the disadvantage that they are damaged or destroyed by the transmission of forces during the comminution operation, such as the hitting with hammers. They can also be damaged during the screening operation, with the result that they have to be replaced. A substrate used both for breaking and for screening on average withstands about 10 to 15 tons of treated material. It is then necessary to replace smashed pieces (approximately 30%), to prevent fragments of the substrate from passing into the material to be used for semiconductor purpose.

Furthermore, these substrates made of silicon have to be disposed of, resulting in further costs. This is because the material is cracked or has been comminuted to undesirable fragment sizes, with the result that it can no longer be used for semi-conductor purpose. The production of such a substrate requires additional separation of silicon, and machining to produce the shaped parts. Also complex purification thereof, is required, for example by etching using $HF/HNO_3$.

SUMMARY OF THE INVENTION

It is an object of the present invention to overcome the drawbacks of the prior art and to provide a device and a method which reduce the additional contamination of semiconductor material during comminution, screening or during transportation.

This above object is achieved according to the present invention by a device for protecting semiconductor material, comprising a support having a surface made of ice formed from ultrapure water; and semiconductor material is placed on said surface.

The device according to the invention is formed by ice, which can be produced in a cost-effective manner from ultrapure water. This ultrapure water preferably has a conductance of greater than 0.07 $\mu$S, and particularly preferably a conductance of greater than 0.05 $\mu$S. This ice made from ultrapure water is preferably situated on the surface of a support. This support can be a substrate made of steel, plastic, a semiconductor material, such as silicon, or another suitable material. In addition, the ice made from ultrapure water may also form a self-supporting block having a surface made from the ultrapure water.

In another embodiment, this ice can be produced by precipitating droplets onto a support. This support can be a solid substrate made from steel, plastic, a semiconductor material, such as preferably silicon, or another suitable solid material. In this case tubes or pipes are attached to the underside of the support; and a cooling liquid, such as preferably an aqueous potassium carbonate solution, flows through these tubes. In order to cool the support more efficiently the pipes are preferably positioned in a heat transfer device. To save energy, that side of the pipes which is remote from the support is usually insulated. The coolant liquid is cooled in a refrigeration machine to preferably less than −10° C., and particularly preferably to approximately −25° C. Then the coolant is pumped through the pipes of the support.

During the cooling operation, and in the following time period, the surface of the substrate is sprayed with ultrapure water which has a conductance as indicated above. The layer of ultrapure ice is caused to grow on the substrate preferably to a thickness of 0.5 cm to 30 cm, or particularly preferably to 5 cm to 20 cm, very particularly preferably to 5 cm to 10 cm. Then semiconductor material, such as silicon or germanium or gallium arsenide, is placed on the layer of ice. This semiconductor material can also be placed on a block of self-supporting ice made from ultrapure water or can be frozen into such a block, so as, for example, to be transported thereby.

Preferably, the semiconductor material, such as the silicon rods produced in accordance with the Siemens process, is placed onto the layer of ice made from ultrapure water. This material can then be comminuted on this ice layer made from ultrapure water. A contamination-free crushing process is used, such as for example with the aid of a hammer made from ultrapure silicon. It is also possible to carry out this comminution between two layers of ice which are forcefully brought together.

The ice-silicon mixture formed is then transported onto a heated silicon substrate using a silicon pushing device and is dried using radiant heaters. After the drying process, it is then possible, for the usual screening to be carried out using silicon screens.

Hence, the present invention further relates to a screening means or device for protecting semiconductor material during the screening of this material.

Furthermore, a screening operation can take place on a screen which is coated with ice made from ultrapure water. It is, however, necessary, in order to achieve a preferred screening result, for the ice to be separated out of the ice-silicon mixture produced during comminution. This can be achieved, for example, by briefly heating the mixture to above the melting point of the water on a silicon substrate. After screening has been carried out, the above-described drying operation then takes place.

Semiconductor material for the known zones refining, such as preferably silicon rods, may be held by the device according to the invention. This is for the purpose of machining, for example cutting to length, or cone grinding of these silicon rods.

It is also possible to produce and use removal aids, for removing the silicon rods from the Siemens reactor. These removal aids are in the form of the device according to the invention.

Furthermore, the device according to the invention, which rests on a substrate preferably made of steel, can be used for the compact mounting of rods made from silicon and for removing the graphite electrode therefrom without contaminating the rod with carbon.

In addition, the present invention relates to a method for protecting semiconductor material by utilizing a device according to the invention.

Preferably the method of the invention for protecting semiconductor material is for comminuting the semiconductor material, which is preferably silicon. The advantage of this comminution using the device according to the invention is that the material to be comminuted cannot be contaminated any further. Also the substrate used for comminution can easily be separated from the semiconductor material and can then be disposed of. This is because the ice made from ultrapure water is simply melted away. This is an extremely friendly environmental process. It is particularly preferred for the support on which the ice made from ultrapure water is situated to be made from silicon. This is because if it should happen that the ice becomes damaged, then the semiconductor material situated on this ice, will come into contact with the silicon support. Thus, the semiconductor material to be comminuted will not be contaminated any further.

While several embodiments of the present invention have been shown and described, it is to be understood that many changes and modifications may be made thereunto without departing from the spirit and scope of the invention as defined in the appended claims.

What is claimed is:

1. A method for protecting rods of semiconductor material, comprising providing a support having a surface made of ice formed of ultrapure water; and placing rods of semiconductor material on said surface.

2. The method for protecting rods of semiconductor material as claimed in claim 1, further comprising comminuting rods of semiconductor material using said support.

3. The method for protecting rods of semiconductor material as claimed in claim 1, further comprising screening rods of semiconductor material using said support.

4. The method for protecting rods of semiconductor material as claimed in claim 1, wherein the support is a solid substrate having said surface made of ice formed from ultrapure water.

5. The method for protecting rods of semiconductor material as claimed in claim 1, wherein the support is a block of self supporting ice and has a surface made of ice formed from ultrapure water.

6. The method for protecting rods of semiconductor material as claimed in claim 1, wherein the support is made of silicon.

7. The method for protecting rods of semiconductor material as claimed in claim 2, wherein the support is a screening means.

* * * * *